United States Patent [19]

Cantrell

[11] Patent Number: 4,736,432
[45] Date of Patent: Apr. 5, 1988

[54] ELECTRONIC SIREN AUDIO NOTCH FILTER FOR TRANSMITTERS

[75] Inventor: William H. Cantrell, Fort Worth, Tex.

[73] Assignee: Motorola Inc., Schaumburg, Ill.

[21] Appl. No.: 807,074

[22] Filed: Dec. 9, 1985

[51] Int. Cl.⁴ .............................................. H04R 3/02
[52] U.S. Cl. ........................................ 381/83; 381/71; 381/86; 381/94; 455/113
[58] Field of Search ..................... 381/71, 83, 86, 94, 381/95, 98; 455/113, 114

[56] References Cited

U.S. PATENT DOCUMENTS

| | | |
|---|---|---|
| 3,644,674 | 2/1972 | Mitchell et al. |
| 3,882,275 | 5/1975 | Carroll. |
| 3,989,897 | 11/1976 | Carver. |
| 4,079,199 | 3/1978 | Patronis, Jr. ........................ 381/83 |
| 4,232,192 | 11/1980 | Beex ................................... 381/83 |
| 4,232,381 | 11/1980 | Rennick et al. |
| 4,453,137 | 6/1984 | Rittenbach. |
| 4,461,025 | 7/1984 | Franklin. |
| 4,496,859 | 1/1985 | Crooks. |
| 4,525,856 | 6/1985 | Admiraal .............................. 381/83 |

Primary Examiner—Jin F. Ng
Assistant Examiner—L. C. Schroeder
Attorney, Agent, or Firm—Donald B. Southard; Edward M. Roney

[57] ABSTRACT

A notch filter as disclosed which is adaptable to notching out a background siren from voice communications from an emergency vehicle. Two embodiments are disclosed. In the first embodiment, a frequency lock loop tracks the fundamental frequency of an electronic siren. The siren fundamental frequency is then notched out from voice transmissions using a notch filter. In the preferred transmissions using a notch filter. In the preferred embodiment, a digital ramp is generated by a first digital signal processor. This signal is input to an amplifier and a speaker thus producing an electronic siren. The digital ramp is also input to a second digital signal processor which notches out the fundamental frequency and odd harmonics thereof from the digital ramp thus acting as a comb notch filter. Analog voice is digitized by way of an analog to digital converter and input to the second digital signal processor. The second digital signal processor combs out the fundamental frequency and odd harmonics of the background siren signal from the digitized voice signal. The digitized voice signal is then converted back to an analog signal by way of a digital to analog converter.

16 Claims, 5 Drawing Sheets

*Fig. 4*
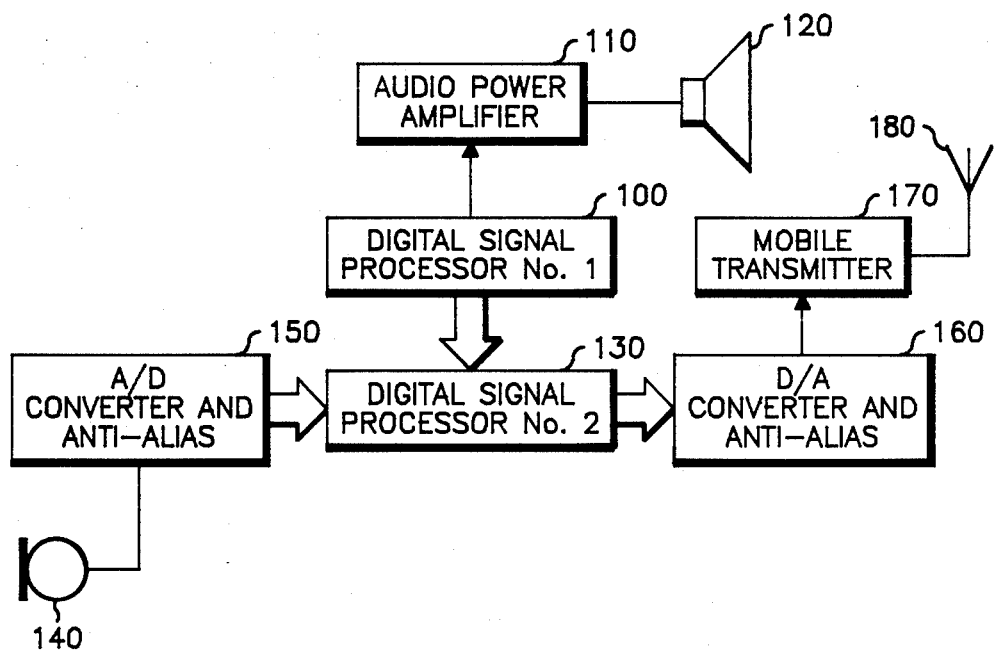
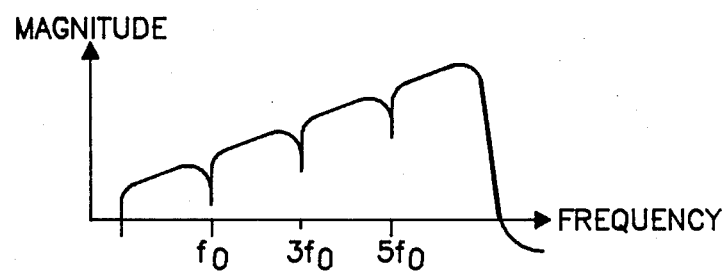
*Fig. 5*

ELECTRONIC SIREN AUDIO NOTCH FILTER FOR TRANSMITTERS

TECHNICAL FIELD

This invention relates to an audio filter for notching out a background signal which is undesired from a voice transmission. Specifically, the invention relates to a tracking notch filter for notching out a background siren from a voice transmission in an emergency vehicle.

BACKGROUND OF THE INVENTION

Frequently it is necessary to transmit a voice communication from a mobile unit while using an audible warning device such as an electronic siren. When the siren is actuated there will be an acoustical path to the mobile microphone. Thus when the mobile operator transmits a voice message, the voice signal will be combined with the background siren signal. This combination will impair the intelligibility of the voice signal perhaps even masking out important emergency information.

The siren signal cannot be merely substrated out due to the unpredicability of the magnitude and phase of the background siren tone at the mobile microphone. Thus the siren signal must be notched out of the composite siren and voice signal.

An example of a conventional method of notching out an undesired frequency from a multi-frequency composite signal is described in U.S. Pat. No. 4,453,137 to Rittenbach. In this patent a signal processor circuit is described which includes a plurality of cascaded stages which are used to notch out a certain frequency from a multi-frequency composite signal. In Rittenbach a conventional frequency locked loop is utilized. Each of the stages contained the composite signal which is contained inside of the frequency lock loop.

Applying the system in Rittenbach to a situation as heretofore described would result in the PA speaker of the electronic siren to mobile microphone audio path being part of the frequency locked loop. Since the siren to microphone feedback loop is highly unpredictable and is variable, this would cause great difficulties in acquiring and maintaining a lock on the siren signal. Although Rittenbach is able to lock on a particular frequency of the composite multi-frequency signal, it would not be able to do so in a situation wherein one of the composite signals was an audio signal from an electronic siren being input at a microphone together with a voice signal. Thus, in this situation, the notch filter as taught by Rittenbach would not improve the intelligibility of the radio operator's voice transmission.

In emergency situations every syllable of the voice transmission could be critical. Thus there exists a need to provide a tracking audio filter for notching out a background electronic siren from the voice transmission to improve intelligibility. Such a filter would be widely received in the industry.

SUMMARY OF THE INVENTION

In accordance with the present invention, a tracking audio filter for notching out a background electronic siren from a radio operator's voice transmission is disclosed. There are two embodiments disclosed.

In the first embodiment, a signal from the electronic siren is input to a frequency locked loop. The frequency locked loop locks on the fundamental frequency of the electronic siren and provides a signal to a voltage controlled variable frequency notch filter. The output from the mobile microphone is then routed through this notch filter and transmitted from a mobile transmitter. In this embodiment the electronic PA audio signal to the microphone is not included in the control loop. Thus the stability of the control loop and hence the overall improved performance of the notch filter is greatly improved.

In the preferred embodiment, an electronic siren is produced from a digital ramp signal generated by a digital signal processor. This digital ramp signal is also used to control a second digital signal processor for providing a comb notch filter for notching out fundamental and odd harmonics of the siren signal. The mobile microphone signal is digitized and routed through the comb notch filter. The signal is then converted back to an analog signal by a conventional D to A convertor and output from a mobile transmitter. Anti-aliasing may be included if the sampling rate of the D to A converter is less than twice the highest frequency to be sampled.

Numerous other advantages and features of the present invention will become readily apparent from the following description of the invention and its various embodiments and from the claims and from the accompanying drawings.

BRIEF DESCRIPTION OF THE DRAWINGS

FIG. 4 is a block diagram of the preferred embodiment of the audio notch filter system in accordance with the present invention.

FIG. 5 is a gain v. frequency curve for the audio notch filter of FIG. 4.

DETAILED DESCRIPTION OF THE INVENTION

Figure 1:
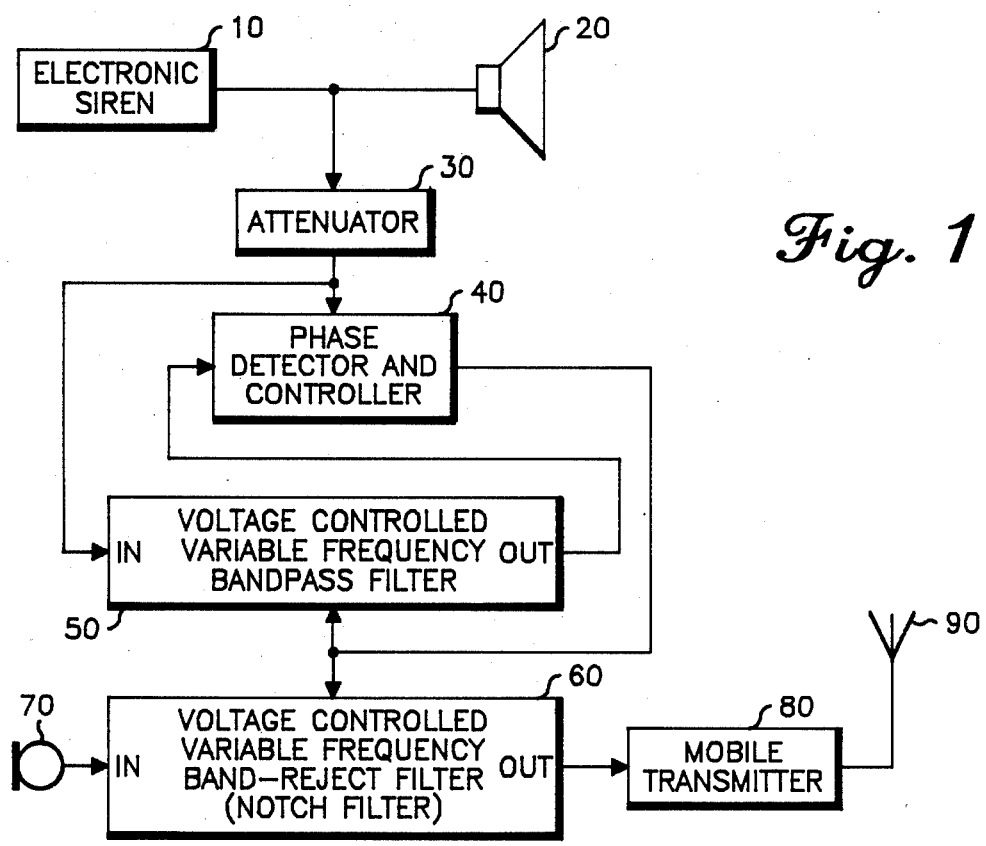
FIG. 1 is a block diagram of one embodiment of the instant invention.

While this invention is susceptible of embodiment in many different forms, there is shown in the drawings which will be herein described in detail, a preferred embodiment of the invention. It should be understood; however, that the present disclosure is to be considered as an exemplification of the principles of the invention and not intended to limit the invention to any specific embodiment illustrated.

Figure 2:
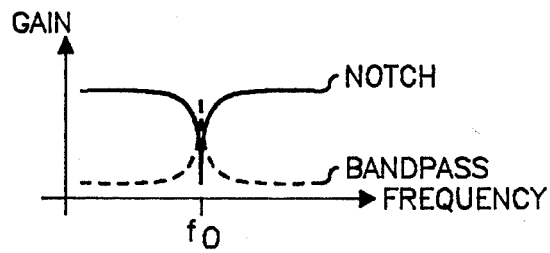
FIG. 2 is a gain versus frequency plot of a band pass and notch filter.

Referring to the drawings, FIG. 1 is a block diagram representation of the audio notch filter in accordance with one embodiment of the present invention. As can be seen from FIG. 1, a conventional electronic siren 10 is output to a public address (PA) speaker 20. A signal from the electronic siren 10 is also input in an attenuator 30. The attenuator is a conventional attenuator and is used to lower the power level of the siren signal. The output of the attenuator 30 is connected to the input of a phase detector and controller 40 and also input to a voltage controlled variable frequency band pass filter 50. The combination of the phase detector and controller 40 and the voltage controlled variable frequency band pass filter 50 comprises what is known as a frequency locked loop. The frequency locked loop or control loop will cause the voltage controlled variable frequency band pass filter 50 to lock on the fundamental frequency of the siren (See FIG. 2).

Figure 3:
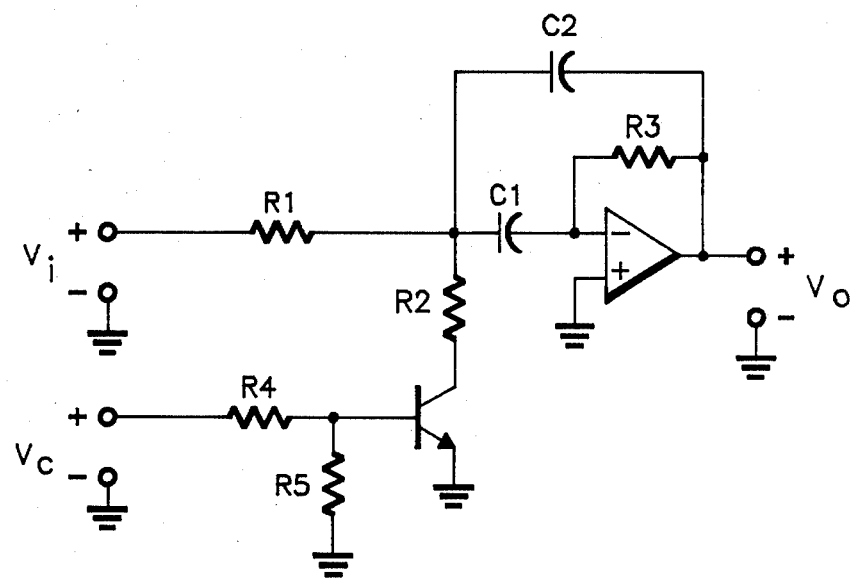
FIG. 3 is a schematic diagram of a voltage controlled variable frequency band pass filter.

Voltage controlled variable frequency band pass and band reject filters are known in the art. Essentially these devices will adjust the center frequency of the filter in response to an input DC voltage. FIG. 3 shows a conventional voltage controlled variable frequency band pass filter which will herein be described. A conventional voltage controlled variable frequency reject filter would be analogous in operation and will not be described.

A voltage controlled variable frequency band pass filter may be comprised of a combination of resistors and capacitors (e.g. R1, R2, R3, C1, C2) and an operational amplifier as configured in FIG. 3. Resistor R2 is tied to ground through a transistor. As shown in FIG. 3, the input to the filter is designated as VI and the output is designated as VO. Port VC is used to accept a controlling DC voltage. In operation, a DC voltage will be applied at the DC voltage input port. This voltage will bias the transistor and turn it on. Varying the DC voltage will vary the collector current of the transistor which in turn will cause DC voltage drops across resistors R1 and R2. This effectively will control the center frequency of the filter.

The frequency locked loop compares the siren fundamental frequency, which is input from attenuator 30, with the output from band pass filter 50. The phase detector then generates a DC controlling voltage to control the center frequency of the band pass filter 50. When the filter is tracking the siren properly there will be a constant phase difference between the two inputs. Net increasing or decreasing phase difference will occur when the filter 50 center frequency does not correspond to the siren fundamental frequency. This will cause a change in the phase detector 40 controlling voltage. The controlling voltage from the phase detector 40 will force the center frequency of the band pass filter 50 to track the siren frequency and lock on it.

The voltage controlled variable frequency band reject filter 60 also tracks the fundamental frequency of the siren using the same control voltage from the phase detector and controller 40. The band reject filter 60 will notch out the siren fundamental frequency from the mobile microphone voice input 70 prior to the signal being transmitted through the mobile transmitter 80 and broadcast from antenna 90.

In this system the PA 20 to mobile microphone 70 audio path is not part of the control loop for the system. As is known by those skilled in the art, this audio path is highly unpredictable and is variable. To include this audio path as part of the feedback loop would result in a system of limited performance. Specifically, it would make it difficult to acquire and maintain a frequency lock on the fundamental frequency of the siren.

The first embodiment of the present invention provides a greatly improved system over that contained in the prior art. For example, in Rittenbach, U.S. Pat. No. 4,453,137, the composite signals designated as F1, F2, F3, which are analogous to the composite signal of the instant invention comprising the voice plus the background siren information at the microphone, is contained in the frequency lock loop. As heretofore stated in the application described with the instant invention, this system would result in very poor performance.

Referring to FIG. 4, an alternate embodiment of the invention is illustrated. In this embodiment, an electronic siren is generated by a digital signal processor 100. This is done by programming the digital signal processor 100 to generate the digital equivalent of a ramp. The programming for this device will be discussed in much more detail below. The output of the ramp which is generated by the digital signal processor 100 is then connected to a conventional audio power amplifier 110 and broadcast out of a PA speaker 120. The digital ramp generated by digital signal processor 100 is then used as a control input to a second digital processor 130. The second digital processor 130 utilizes the digital ramp data to generate a comb filter which is shown in FIG. 5.

As can be seen from FIG. 5, this comb filter not only notches out the fundamental frequency $f_0$ but also odd harmonics of the fundamental frequency.

In order to use the digital signal processor embodiment, it is necessary to convert the analog voice signal from the microphone 140 to a digital signal by way of an A to D converter 150. This A to D converter would be a conventional A to D converter and would process the input analog voice data so as to transform it into a digital signal. This digitized voice signal then would be input into the digital signal processor 130 which would comb out the fundamental and odd frequency harmonics of the siren. The output voice signal then would be reconverted back to an analog signal by way of a conventional D to A converter 160 then transmitted from the mobile transmitter 170 by way of an antenna 180.

Pre-emphasis and splatter filtering could be done digitally by the digital signal processor No. 2 at the same time that the comb notch filter was being generated.

Additionally, anti-aliasing could be added to the D to A and the A to D converters. The anti-aliasing would be utilized when the sampling rate would be less than the ideal twice the highest frequency of the incoming signal. The number of harmonics notched out of the siren signal could be varied depending on the desired voice distortion reduction range to be effected.

Digital signal processors (DSP) are well known in the art and are programmable devices which are capable of processing voice frequency range signals in real time. Conventional DSPs are made by NEC and Texas Instruments. A suitable DSP for implementation of DSP No. 1 and DSP No. 2 would be a Texas Instruments TMS 32020.

Figure 6:
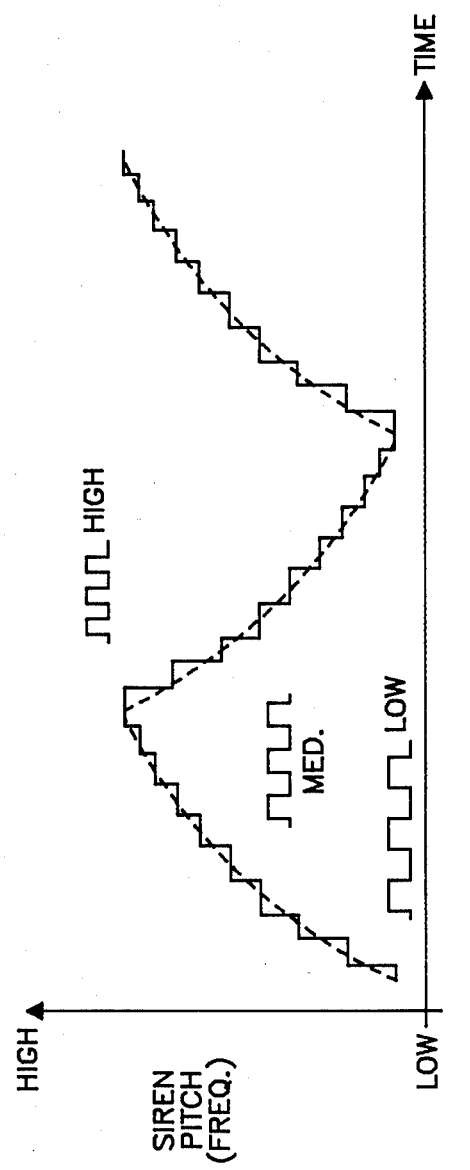
FIG. 6 is a time frequency diagram of the siren.

Referring to FIG. 6, the dotted line represents a typical analog siren that varies in frequency with time. The equivalent of this analog siren is generated by DSP No. 1. The solid lines in FIG. 6 represents the digital equivalent of the analog siren. This digital equivalent is formed by sequentially combining square waves of a particular frequency for a particular time duration. More specifically the beginning portion of the curve would utilize, for example, low frequency square waves for a preset duration and the apex of the curve may be comprised of higher frequency square waves for another preset time duration. Thus by sequentially combining different frequency square waves for a particular time period, a digital equivalent to an analog siren can be generated.

Figure 7:
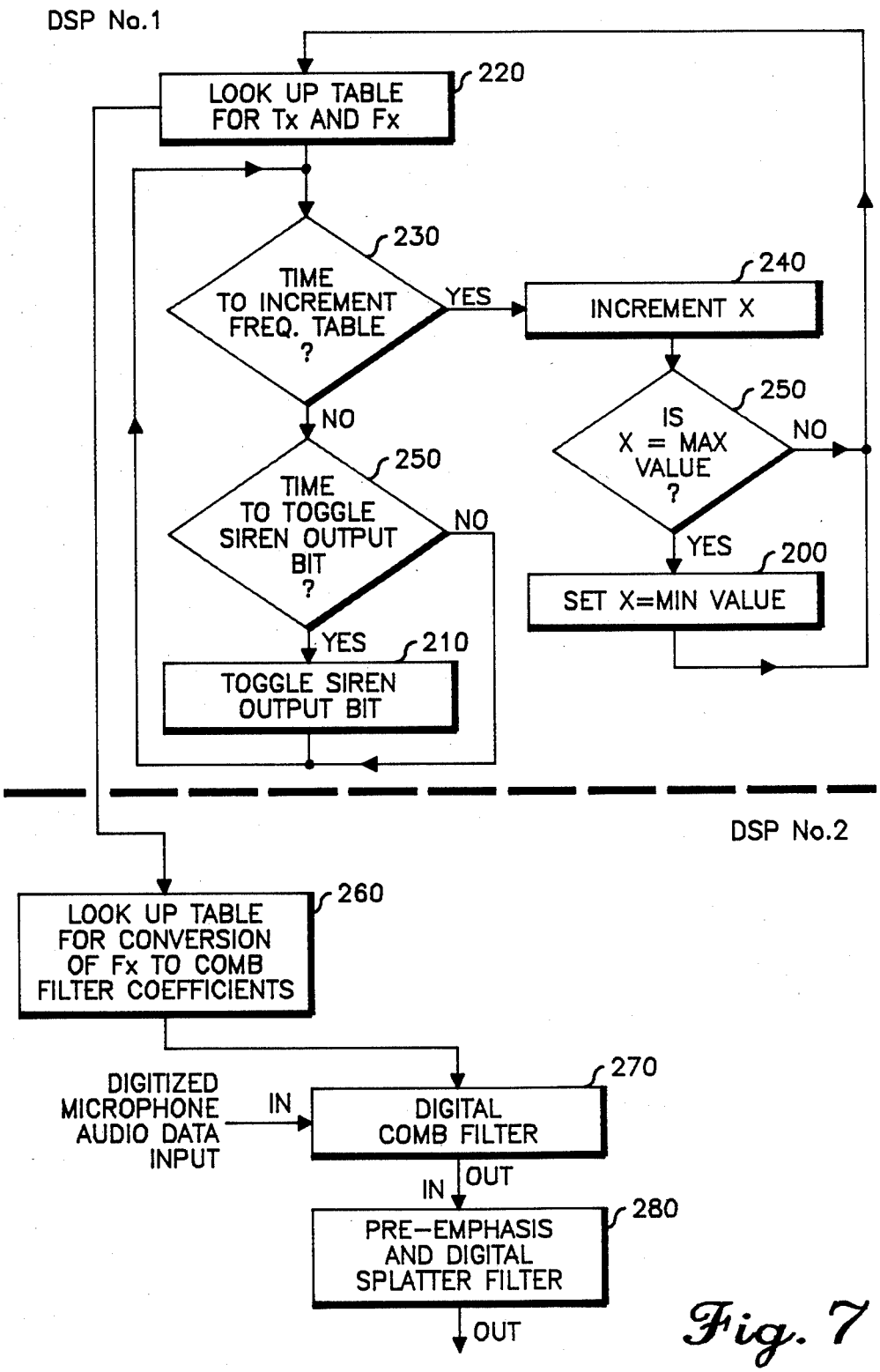
FIG. 7 is a flow chart for the digital signal processors used in the preferred embodiment described in FIG. 4.

FIG. 7 represents the flow chart for both DSP No. 1 and DSP No. 2. The upper portion of the flow chart enclosed in dashed lines is associated with DSP No. 1. The lower portion of the flow chart also enclosed in dashed lines is associated with DSP No. 2. As will be well understood by those skilled in the art, that by using a Texas Instruments TMS 32020, that the entire flow chart can be implemented using only one DSP. However, for purposes of explanation, the system will be hereinafter discussed utilizing two DSP's.

The flow chart for DSP No. 1 begins at step 200. In this step, the system is initialized and started off at a minimum value X=1 (e.g. $f_1$, $T_1$). The toggle siren output bit 210 will then be toggled at a frequency $f_1$ for a time period $t_1$. All frequency $f_x$ and corresponding time $t_x$ values are contained in a look up table 220. In the next step 230, a decision is made as to whether to increment x. X will be incremented after $t_x$ has timed out. If $t_x$ is not timed out the toggle siren output 210 will be toggled until $t_x$ is timed out. If $t_x$ is timed out, x will be incremented in step 240. While the frequency table is being incremented decision block 250 prevents the siren output bit 210 from being toggled.

The next step determines if X has reached its maximum value. If not, the program will continue cycling. Once the maximum value is reached, the system then resets; x is set to a minimum value (e.g. $F_1$, $t_1$) and begins cycling again.

As new frequencies are chosen from look-up table 220 for DSP No. 1, this information is sent to the look up table 260 for DSP No. 2. This look up table contains filter coefficients. These filter coefficients are used to program DSP No. 2 as a digital comb filter capable of notching the fundamental and odd harmonics of the signal being generated by DSP No. 1. DSP No. 2 may also be programmed for digital splatter and pre-emphasis filtering 280.

Thus it should be apparent that a unique siren notch filter is disclosed and a method for making the same. The audio notch filter and the method for making it are adaptable to conventional design practices. Moreover, while this convention is described in conjunction with specific embodiments, it should be apparent that there are alternatives, modifications, and variations which will be apparent to those skilled in the art of the foregoing description. Accordingly, it is intended to cover all such alternatives, modifications, and variations that fall within the spirit and the broad scope of the appended claims.

What is claimed is:

1. An audio comb notch filter system adaptable to receiving a composite signal comprising at least a first signal and a second signal and notching out the fundamental frequency and one or more harmonics thereof of said first or second signal comprising:
   a. first means for generating a ramp signal;
   b. Second means responsive to said ramp signal for controlling a comb notch filter for notching out the fundamental and one or more harmonics of one of said signals.

2. An audio comb notch filter as described in claim 1 wherein said first signal comprises a digital ramp.

3. An audio comb notch filter as described in claim 1 wherein said first means comprises a digital signal processor.

4. An audio comb notch filter as described in claim 1 wherein said second means comprises a digital signal processor.

5. An electronic siren and audio comb filter for use in emergency vehicles for notching out background siren sounds from voice transmissions comprising;
   first means for generating a digital signal;
   amplifier means electrically coupled to said first means for amplifying said digital signal;
   speaker means coupled to said amplifier means for converting said digital signal to an audible sound;
   second means having an input means and output means and adapted to receive a composite signal at said input means comprised of said digital signal and a second signal, said second means being operatively coupled to said first means and responsive thereto for notching out the fundamental frequency and one or more harmonics of said digital signal from said composite signal.

6. The notch filter as described in claim 5 wherein said digital signal comprises a digital ramp.

7. The notch filter as described in claim 6 wherein said audible sound comprises a siren.

8. The notch filter as described in claim 5 wherein said first means comprises a first digital signal processor.

9. The notch filter as described in claim 5 wherein said second means comprises a second digital signal processor.

10. The audio notch filter as described in claim 5 wherein said second signal comprises a digitized voice signal.

11. The comb notch filter as described in claim 5 wherein said second means includes an analog to digital converter for receiving an input analog second signal and a digital to analog converter for outputting an analog signal.

12. The comb notch filter as described in claim 5 wherein said second means also contains means for pre-emphasis filtering.

13. The comb notch filter as described in claim 5 wherein said second means also contains means for splatter filtering.

14. The comb notch filter as described in claim 5 wherein said digital signals are notched out.

15. The comb notch filter as described in claim 11 wherein said analog to digital converter further includes means for anti-aliasing.

16. The comb notch filter as described in claim 11 wherein said digital to analog converter further includes means for anti-aliasing.

* * * * *

UNITED STATES PATENT AND TRADEMARK OFFICE
CERTIFICATE OF CORRECTION

PATENT NO. : 4,736,432

DATED : April 5, 1988

INVENTOR(S) : William H. Cantrell

It is certified that error appears in the above-identified patent and that said Letters Patent is hereby corrected as shown below:

In the Abstract, lines 7-8, delete "In the preferred transmissions using a notch filter."

Signed and Sealed this

Fourth Day of October, 1988

Attest:

DONALD J. QUIGG

Attesting Officer

Commissioner of Patents and Trademarks